(12) United States Patent
Hatanaka et al.

(10) Patent No.: US 11,303,254 B2
(45) Date of Patent: Apr. 12, 2022

(54) AMPLIFIER

(71) Applicant: Mitsubishi Electric Corporation, Tokyo (JP)

(72) Inventors: Shohei Hatanaka, Tokyo (JP); Katsuya Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 22 days.

(21) Appl. No.: 17/043,862

(22) PCT Filed: May 28, 2018

(86) PCT No.: PCT/JP2018/020320
§ 371 (c)(1),
(2) Date: Sep. 30, 2020

(87) PCT Pub. No.: WO2019/229796
PCT Pub. Date: Dec. 5, 2019

(65) Prior Publication Data
US 2021/0143781 A1 May 13, 2021

(51) Int. Cl.
*H03F 3/24* (2006.01)
*H01L 23/00* (2006.01)
*H03F 3/68* (2006.01)

(52) U.S. Cl.
CPC .............. *H03F 3/24* (2013.01); *H01L 24/49* (2013.01); *H03F 3/68* (2013.01); *H01L 2224/48137* (2013.01)

(58) Field of Classification Search
CPC ... H03F 3/24; H03F 3/68; H01L 24/49; H01L 2224/48137
See application file for complete search history.

(56) References Cited

U.S. PATENT DOCUMENTS

| | | | |
|---|---|---|---|
| 6,396,342 B1* | 5/2002 | Takenaka | H01L 23/66 |
| | | | 257/E27.012 |
| 9,972,588 B2 | 5/2018 | Kato | |

(Continued)

FOREIGN PATENT DOCUMENTS

| | | |
|---|---|---|
| JP | S63-160253 A | 7/1988 |
| JP | H11-238851 A | 8/1999 |

(Continued)

OTHER PUBLICATIONS

International Search Report; Written Opinion; and Notification of Transmittal of the International Search Report and the Written Opinion of the International Searching Authority, or the Declaration issued in PCT/JP2018/020320; dated Aug. 21, 2018.

(Continued)

*Primary Examiner* — Nguyen T Vo
(74) *Attorney, Agent, or Firm* — Studebaker & Brackett PC (57) ABSTRACT

An amplifier includes: a first transistor chip including a plurality of cells and provided beside an input matching substrate; a second transistor chip including a plurality of cells and provided beside the input matching substrate; a plurality of first bonding wires connecting the input matching substrate and the first transistor chip; and a plurality of second bonding wires connecting the input matching substrate and the second transistor chip, and variance of the mutual inductance of the first bonding wires and the second bonding wires is compensated by adjusting the self-inductance of the first bonding wires and the second bonding wires.

20 Claims, 9 Drawing Sheets

(56) References Cited

U.S. PATENT DOCUMENTS

| | | |
|---|---|---|
| 2010/0140721 A1 | 6/2010 | Takagi |
| 2017/0077012 A1* | 3/2017 | Kosaka ............... H01L 23/4952 |
| 2017/0194282 A1 | 7/2017 | Huang et al. |
| 2018/0090456 A1* | 3/2018 | Kato ....................... H01P 3/081 |
| 2019/0356274 A1* | 11/2019 | Zhu ......................... H01L 24/49 |

FOREIGN PATENT DOCUMENTS

| | | |
|---|---|---|
| JP | 2001-102872 A | 4/2001 |
| JP | 2010-161348 A | 7/2010 |
| JP | 2013-105978 A | 5/2013 |
| JP | 2017-059650 A | 3/2017 |
| JP | 2017-531914 A | 10/2017 |

OTHER PUBLICATIONS

Office Action issued in JP 2018-555776; mailed by the Japan Patent Office dated Feb. 5, 2019.

* cited by examiner

AMPLIFIER

FIELD

The present invention relates to an amplifier.

BACKGROUND

For example, a high-output amplifier for communication synthesizes outputs from a plurality of transistors and then outputs the synthesized outputs. Specifically, a plurality of transistor chips are arranged, and each of a plurality of cells of the transistor chips is connected with input and output terminals through a matching circuit board. Bonding wires are often used for this connection.

When a transistor chip and a matching circuit board are connected with each other through a plurality of bonding wires, the mutual inductance is generated from coupling between the bonding wires due to a magnetic field. The inductance of each bonding wire is expressed in the sum of the self-inductance of the bonding wire itself and the mutual inductance of the bonding wire with an adjacent bonding wire.

When a plurality of wires have the same wire shape including length, direction, and height and the same wire diameter, the self-inductance is equal among the wires. On the other hand, the magnitude of the mutual inductance strongly depends on the distance between adjacent bonding wires and the number of adjacent bonding wires. Thus, the mutual inductance of a bonding wire at an end part among a plurality of bonding wires provided side by side is smaller than the mutual inductance of a bonding wire at a non-end part. Due to such mutual inductance difference, the inductance of a bonding wire at an end part is smaller than the inductance of a bonding wire at a non-end part.

When the inductance is ununiform among a plurality of bonding wires, the source impedance is ununiform among transistors of the cells. As a result, ununiform operation of the transistors occurs. Specifically, variance occurs to the amplitudes and phases of signals input to the transistors of the cells and decreases the gain, output electrical power, efficiency, and stability of the amplifier.

PTL 1 discloses that, in an amplifier including one transistor chip, inductance distribution of input and output bonding wires or input and output transmission lines are adjusted to synchronize signal phases, thereby improving the gain and the output electrical power and preventing oscillation due to unbalance operation of each FET cell.

PRIOR ART

Patent Literature

[PTL 1] JP 2010-161348 A

SUMMARY

Technical Problem

An amplifier in which two or more transistor chips are integrated in one package has been desired to reduce the size and cost of the amplifier. For example, when the interval between a first transistor chip and a second transistor chip is small, coupling due to a magnetic field occurs between a first bonding wire connected with the first transistor chip and a second bonding wire connected with the second transistor chip. In this case, ununiform operation of transistors cannot be prevented without considering that the first bonding wire and the second bonding wire are adjacent to each other and therefore magnetically coupled with each other and mutual inductance is generated.

The present invention is intended to solve the above-described problem and to provide an amplifier that prevents ununiform operation of a plurality of transistor chips due to difference in mutual inductance among a plurality of bonding wires in a structure in which the transistor chips are adjacent to each other.

Means for Solving the Problems

An amplifier according to the invention of the present application includes: an input terminal; an input matching substrate; a plurality of input bonding wires connecting the input terminal and the input matching substrate; a first transistor chip including a plurality of cells and provided beside the input matching substrate; a second transistor chip including a plurality of cells and provided beside the input matching substrate; a plurality of first bonding wires connecting the input matching substrate and the first transistor chip; and a plurality of second bonding wires connecting the input matching substrate and the second transistor chip. The first bonding wires include a first nearby wire nearest to the second bonding wires, a first remote wire farthest from the second bonding wires, and a first middle wire positioned between the first nearby wire and the first remote wire. The second bonding wires include a second nearby wire nearest to the first bonding wires, a second remote wire farthest from the first bonding wires, and a second middle wire positioned between the second nearby wire and the second remote wire. Self-inductance of the first nearby wire, the first remote wire, the second nearby wire, and the second remote wire is larger than self-inductance of the first middle wire and the second middle wire. Self-inductance of the first remote wire and the second remote wire is larger than self-inductance of the first nearby wire and the second nearby wire.

Other features of the present invention are clearly described below.

Advantageous Effects of Invention

According to the present invention, it is possible to achieve uniform or substantially uniform operation of a plurality of transistor chips by employing a structure that reduces variance of inductance due to variance of mutual inductance in a structure in which the transistor chips are adjacent to each other.

DESCRIPTION OF EMBODIMENTS

The following describes an amplifier according to each embodiment of the present invention with reference to the accompanying drawings. Components identical or corresponding to each other are denoted by an identical reference sign, and duplicate description thereof is omitted in some cases.

Embodiment 1

Figure 1:
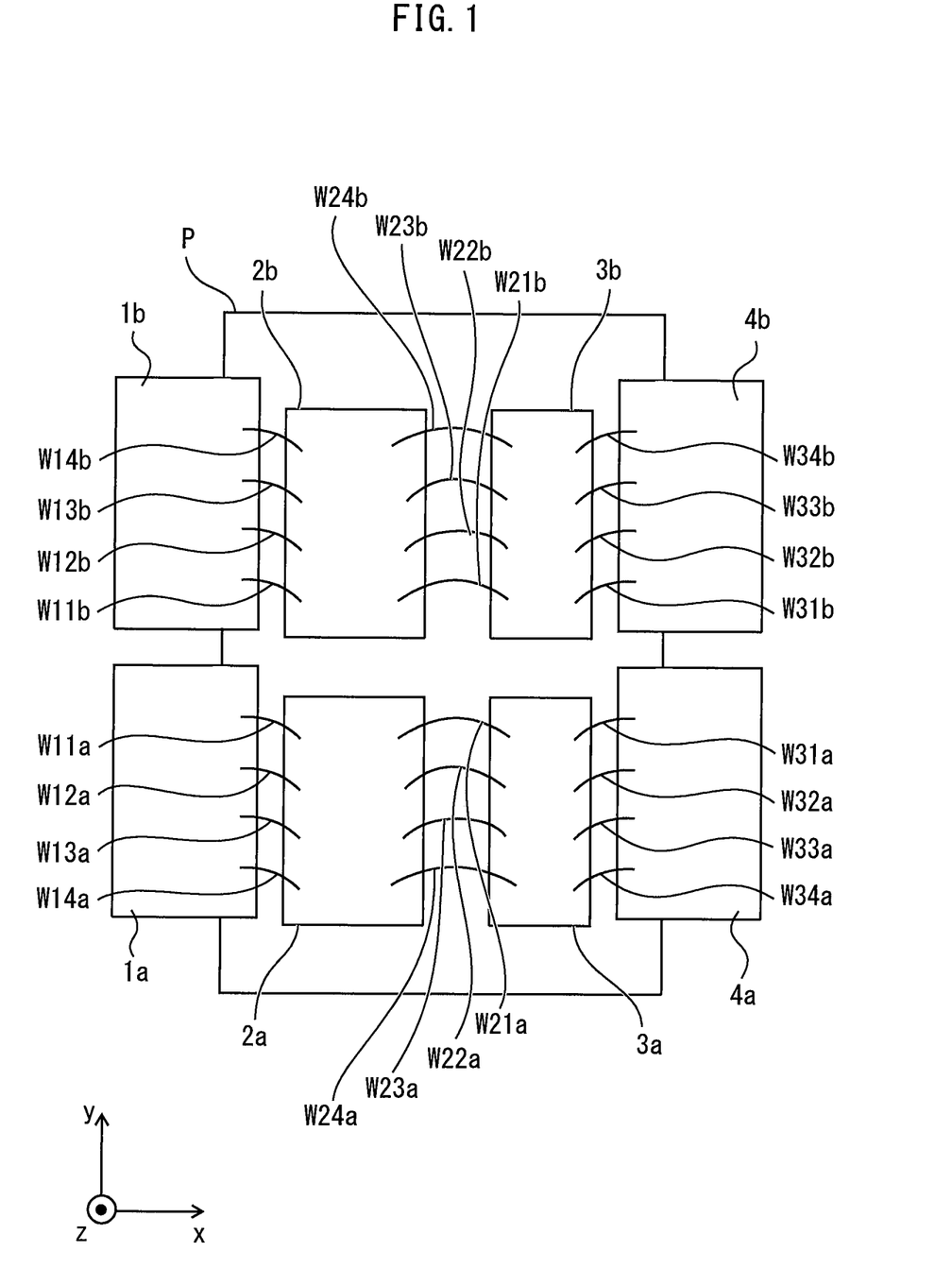
FIG. 1 is a plan view of an amplifier according to Embodiment 1.

FIG. 1 is a plan view of an amplifier according to Embodiment 1 of the present invention. In FIG. 1, for the purpose of illustration, only an outline is illustrated for a package P. Input terminals 1a and 1b and output terminals 4a and 4b are attached to the package P. For example, the input terminals 1a and 1b are disposed opposite to the output terminals 4a and 4b by fixing the input terminals 1a and 1b on the left side of the package P and fixing the output terminals 4a and 4b on the right side of the package P.

Input matching substrates 2a and 2b, a first transistor chip 3a, and a second transistor chip 3b are housed in the package P. The input matching substrates 2a and 2b each include, for example, a dielectric substrate, and a metal layer deposited on the dielectric substrate. The dielectric substrate may be replaced with, for example, a semiconductor substrate such as a GaAs substrate. For example, an electric signal such as a high-frequency signal transmits through the metal layer.

The first transistor chip 3a and the second transistor chip 3b are each a multi-cell transistor including a plurality of cells. The first transistor chip 3a and the second transistor chip 3b may be made of, for example, GaN deposited on a SiC substrate. The kinds of the first transistor chip 3a and the second transistor chip 3b are not particularly limited but may be, for example, GaN-HEMT. The first transistor chip 3a and the second transistor chip 3b each have a structure in which, for example, four transistor cells are disposed in parallel. The number of cells in each transistor chip is not particularly limited but only needs to be two or larger, and may be, for example, five or larger. The first transistor chip 3a is provided beside the input matching substrate 2a, and the second transistor chip 3b is provided beside the input matching substrate 2b.

The input terminal 1a and the input matching substrate 2a are connected with each other through a plurality of input bonding wires W11a, W12a, W13a, and W14a. The input terminal 1b and the input matching substrate 2b are connected with each other through a plurality of input bonding wires W11b, W12b, W13b, and W14b. For example, the inductance of the input bonding wires W11a, W12a, W13a, W14a, W11b, W12b, W13b, and W14b is uniform.

The input matching substrate 2a and the first transistor chip 3a are connected with each other through a plurality of first bonding wires. The input matching substrate 2b and the second transistor chip 3b are connected with each other through a plurality of second bonding wires. The first bonding wires are disposed, for example, at an interval of 350 μm, and the second bonding wires are disposed, for example, at an interval of 350 μm.

The first bonding wires include a first nearby wire W21a nearest to the second bonding wires, a first remote wire W24a farthest from the second bonding wires, and first middle wires W22a and W23a positioned between the first nearby wire W21a and the first remote wire W24a.

The second bonding wires include a second nearby wire W21b nearest to the first bonding wires, a second remote wire W24b farthest from the first bonding wires, and second middle wires W22b and W23b positioned between the second nearby wire W21b and the second remote wire W24b. The interval between the first nearby wire W21a and the second nearby wire W21b is, for example, 700 μm.

The first nearby wire W21a, the first remote wire W24a, the second nearby wire W21b, and the second remote wire W24b are longer than the first middle wires W22a and W23a and the second middle wires W22b and W23b. In other words, the wires at end parts among the first bonding wires provided side by side are longer than the wires at non-end parts. The wires at end parts among the second bonding wires provided side by side are longer than the wires at non-end parts.

The first remote wire W24a and the second remote wire W24b are longer than the first nearby wire W21a and the second nearby wire W21b. In other words, among the first bonding wires provided side by side, the wire farthest from the second bonding wires is longer than the wire nearest to the second bonding wires. Among the second bonding wires provided side by side, the wire farthest from the first bonding wires is longer than the wire nearest to the first bonding wires. The diameters of all first bonding wires and all second bonding wires may be equal.

The first transistor chip 3a and the output terminal 4a are connected with each other through output bonding wires W31a, W32a, W33a, and W34a. The second transistor chip 3b and the output terminal 4b are connected with each other through output bonding wires W31b, W32b, W33b, and W34b. The lengths and diameters of the output bonding wires W31a, W32a, W33a, W34a, W31b, W32b, W33b, and W34b may be equal.

The amplifier can be regarded as including two amplifiers inside the package P. The first amplifier includes the input terminal 1a, the input matching substrate 2a, the first transistor chip 3a, the output terminal 4a, and wires connecting these components. The second amplifier includes the input terminal 1b, the input matching substrate 2b, the second transistor chip 3b, the output terminal 4b, and wires connecting these components. The first amplifier and the second amplifier are disposed adjacent to each other in the package P.

The mutual inductance is ununiform among the first bonding wires and the second bonding wires. Specifically, the mutual inductance of the first nearby wire W21a, the first remote wire W24a, the second nearby wire W21b, and the second remote wire W24b is smaller than the mutual inductance of the first middle wires W22a and W23a and the second middle wires W22b and W23b. In addition, the mutual inductance of the first remote wire W24a and the second remote wire W24b is smaller than the mutual inductance of the first nearby wire W21a and the second nearby wire W21b.

Since the mutual inductance is ununiform as described above, the self-inductance of the first bonding wires and the second bonding wires is ununiform when the inductance of these wires is uniform. Thus, inductance variance due to ununiformity of the mutual inductance can be canceled or reduced by adjusting the lengths of the first bonding wires and the second bonding wires as described above. Specifically, the first nearby wire W21a, the first remote wire W24a, the second nearby wire W21b, and the second remote wire W24b are longer than the first middle wires W22a and W23a and the second middle wires W22b and W23b, and the first remote wire W24a and the second remote wire W24b are longer than the first nearby wire W21a and the second nearby wire W21b. The inductance of the first bonding wires and the second bonding wires can be made uniform or close to uniform by compensating variance of the mutual inductance through self-inductance adjustment. This contributes to uniform operation of the transistors.

The amplifier can be used as, for example, a high-frequency semiconductor device. The above description is made on the configuration in which two transistor chips are arranged, but three or more transistor chips may be arranged in line. In such a case, as well, the operation of the amplifier can be made uniform or substantially uniform by applying the above-described wire length adjustment.

Figure 2:
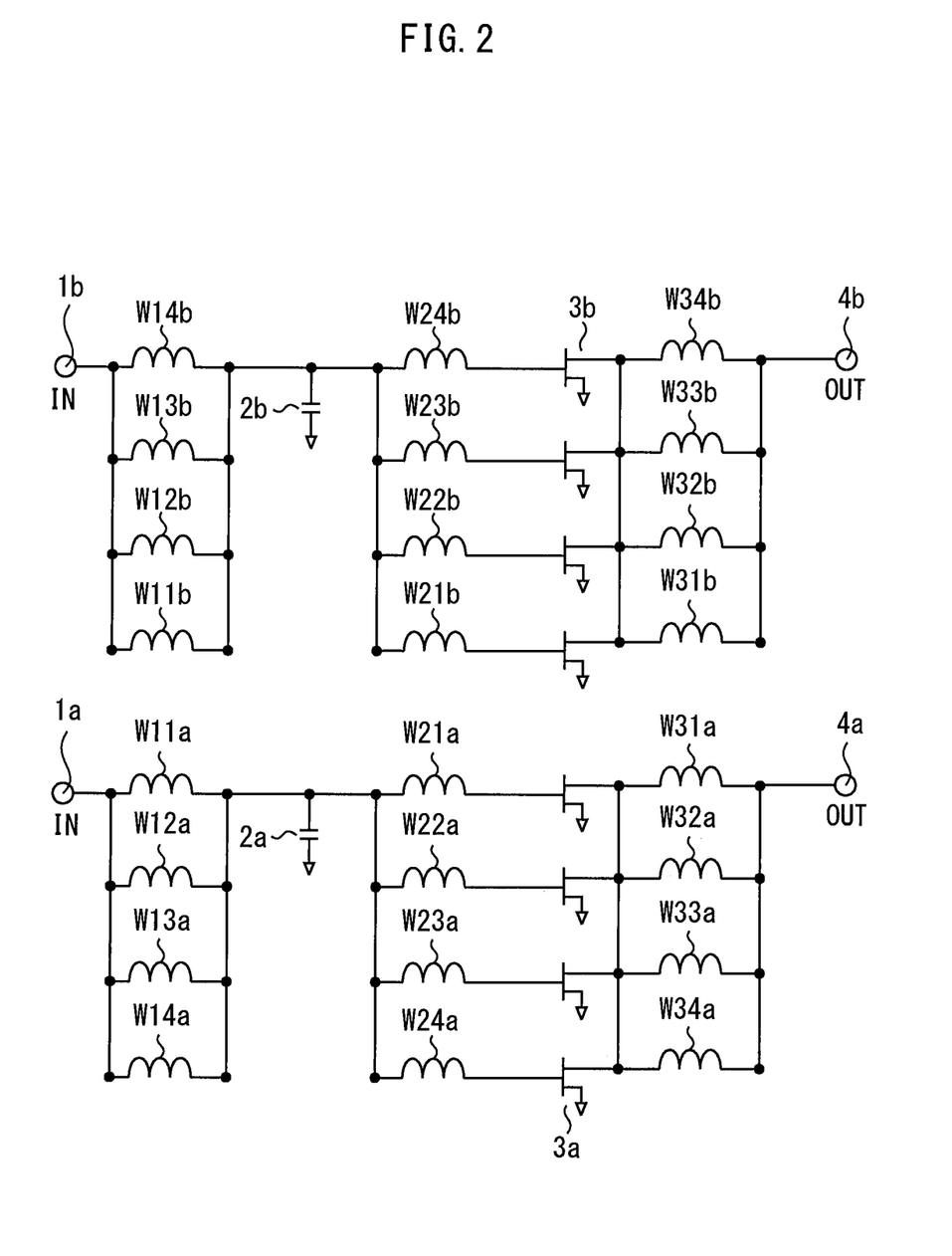
FIG. 2 is an equivalent circuit diagram.

FIG. 2 is an equivalent circuit diagram of the amplifier according to Embodiment 1. The input terminals 1a and 1b may be one terminal. The output terminals 4a and 4b may also be one terminal. Amplifiers according to the embodiments below have a large number of features common to those of Embodiment 1, and thus its difference from Embodiment 1 will be mainly described. At least modification described in Embodiment 1 is applicable to the amplifiers according to the embodiments below.

Embodiment 2

Figure 3:
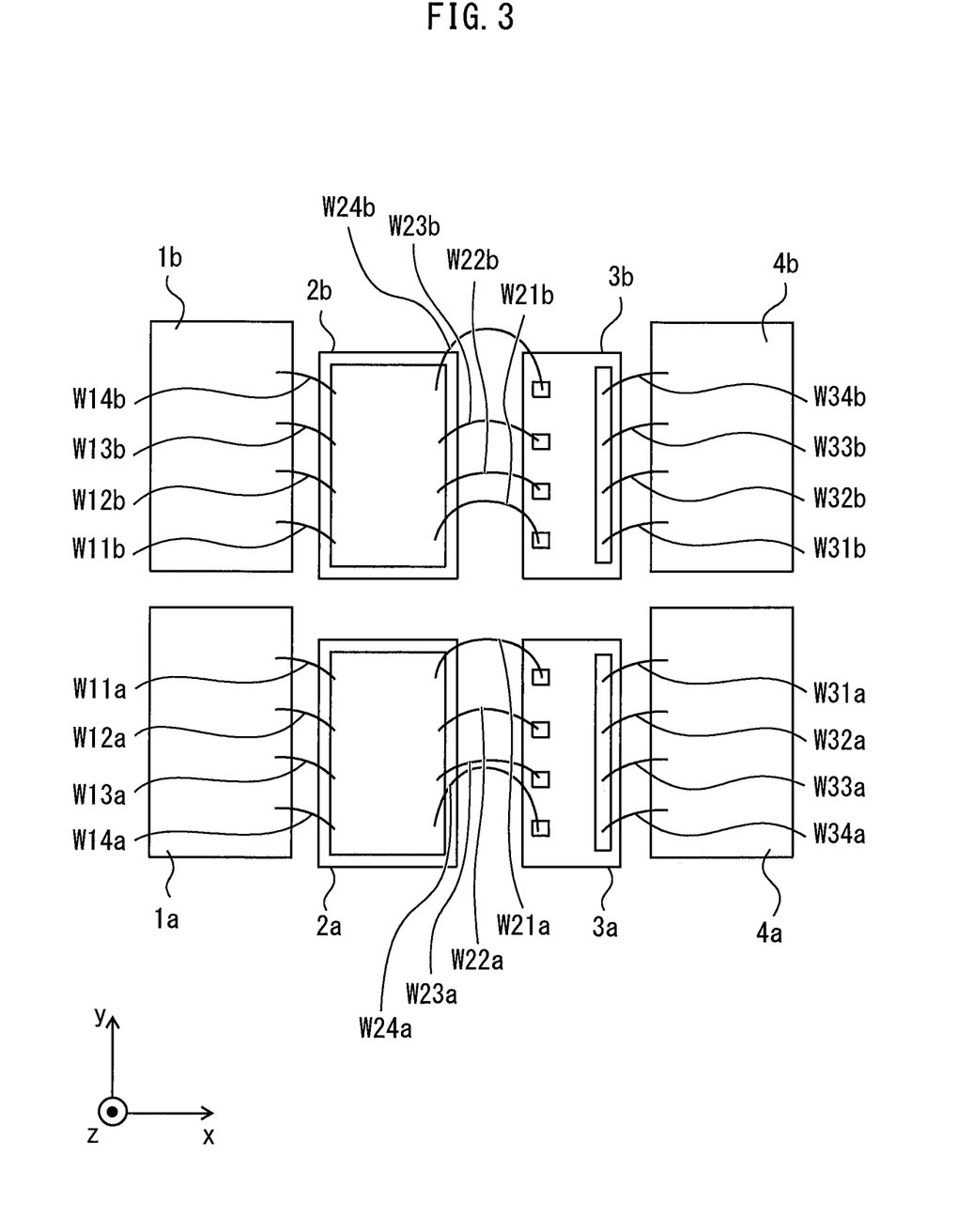
FIG. 3 is a plan view of an amplifier according to Embodiment 2.

FIG. 3 is a diagram illustrating the inside of the package of an amplifier according to Embodiment 2. The first nearby wire W21a, the first remote wire W24a, the second nearby wire W21b, and the second remote wire W24b are higher than the first middle wires W22a and W23a and the second middle wires W22b and W23b. The first remote wire W24a and the second remote wire W24b are higher than the first nearby wire W21a and the second nearby wire W21b.

As for the first bonding wires connecting the input matching substrate 2a and the first transistor chip 3a, and the second bonding wires connecting the input matching substrate 2b and the second transistor chip 3b, for example, the x coordinates of points of connection with the input matching substrates may be equal, and the x coordinates of points of connection with the transistor chips may be equal.

In the amplifier according to Embodiment 2, the self-inductance is adjusted by wire height adjustment to compensate variance of the mutual inductance. The inductance of the first bonding wires and the second bonding wires is made substantially uniform through the wire height adjustment. Accordingly, the efficiency can be improved by, for example, approximately 0.7 pts. An equivalent circuit diagram of the amplifier according to Embodiment 2 is the same as that of Embodiment 1 and illustrated in FIG. 2.

Embodiment 3

Figure 4:
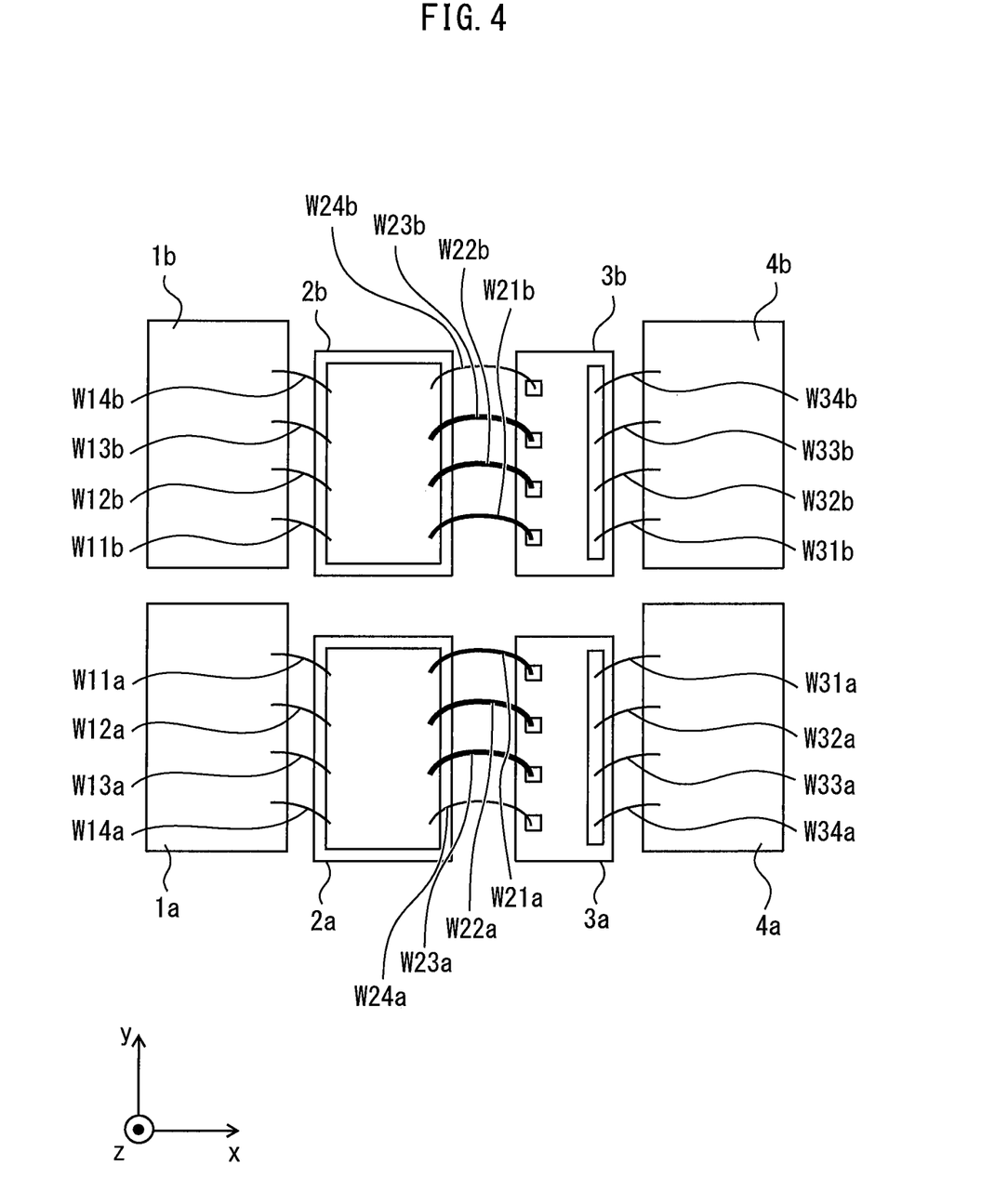
FIG. 4 is a plan view of an amplifier according to Embodiment 3.

FIG. 4 is a diagram illustrating the inside of the package of an amplifier according to Embodiment 3. The first nearby wire W21a, the first remote wire W24a, the second nearby wire W21b, and the second remote wire W24b are narrower than the first middle wires W22a and W23a and the second middle wires W22b and W23b. The first remote wire W24a and the second remote wire W24b are narrower than the first nearby wire W21a and the second nearby wire W21b. Here, being narrow means having a small wire diameter.

As for the first bonding wires connecting the input matching substrate 2a and the first transistor chip 3a and the second bonding wires connecting the input matching substrate 2b and the second transistor chip 3b, for example, the x coordinates of points of connection with the input matching substrates may be equal, and the x coordinates of points of connection with the transistor chips may be equal.

In the amplifier according to Embodiment 3, the self-inductance is adjusted by wire thickness adjustment to compensate variance of the mutual inductance. The inductance of the first bonding wires and the second bonding wires is made substantially uniform through the wire thickness adjustment. An equivalent circuit diagram of the amplifier according to Embodiment 3 is the same as that of Embodiment 1 and illustrated in FIG. 2.

Embodiments 1 to 3 describe above that the lengths, heights, or thicknesses of the first bonding wires and the second bonding wires are adjusted to adjust the self-inductance of the wires. Specifically, the self-inductance of the first nearby wire W21a, the first remote wire W24a, the second nearby wire W21b, and the second remote wire W24b is larger than the self-inductance of the first middle wires W22a and W23a and the second middle wires W22b and W23b. In addition, the self-inductance of the first remote wire W24a and the second remote wire W24b is larger than the self-inductance of the first nearby wire W21a and the second nearby wire W21b. The target of the adjustment does not need to be one of the length, height, and thickness of each wire, and their adjustment may be performed in combination. An optional method of adjusting the self-inductance may be employed.

Embodiment 4

The adverse effect of variation in the mutual inductance of wires when a plurality of transistor chips are adjacent to each other can be solved by means other than wire adjustment. Embodiment 4 and the subsequent embodiments are intended to achieve uniform operation of transistors through pattern length adjustment.

Figure 5:
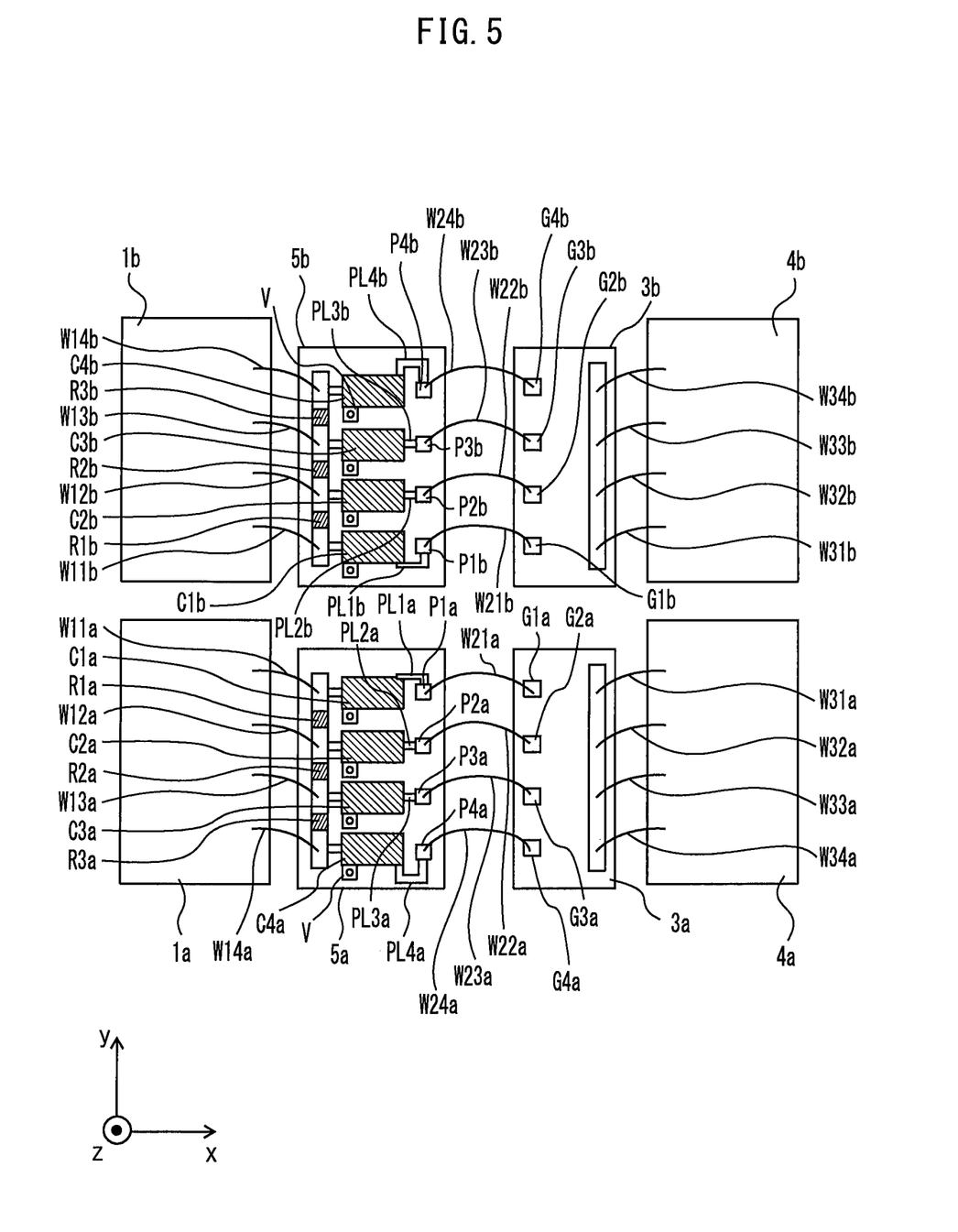
FIG. 5 is a plan view of an amplifier according to Embodiment 4.
Figure 6:
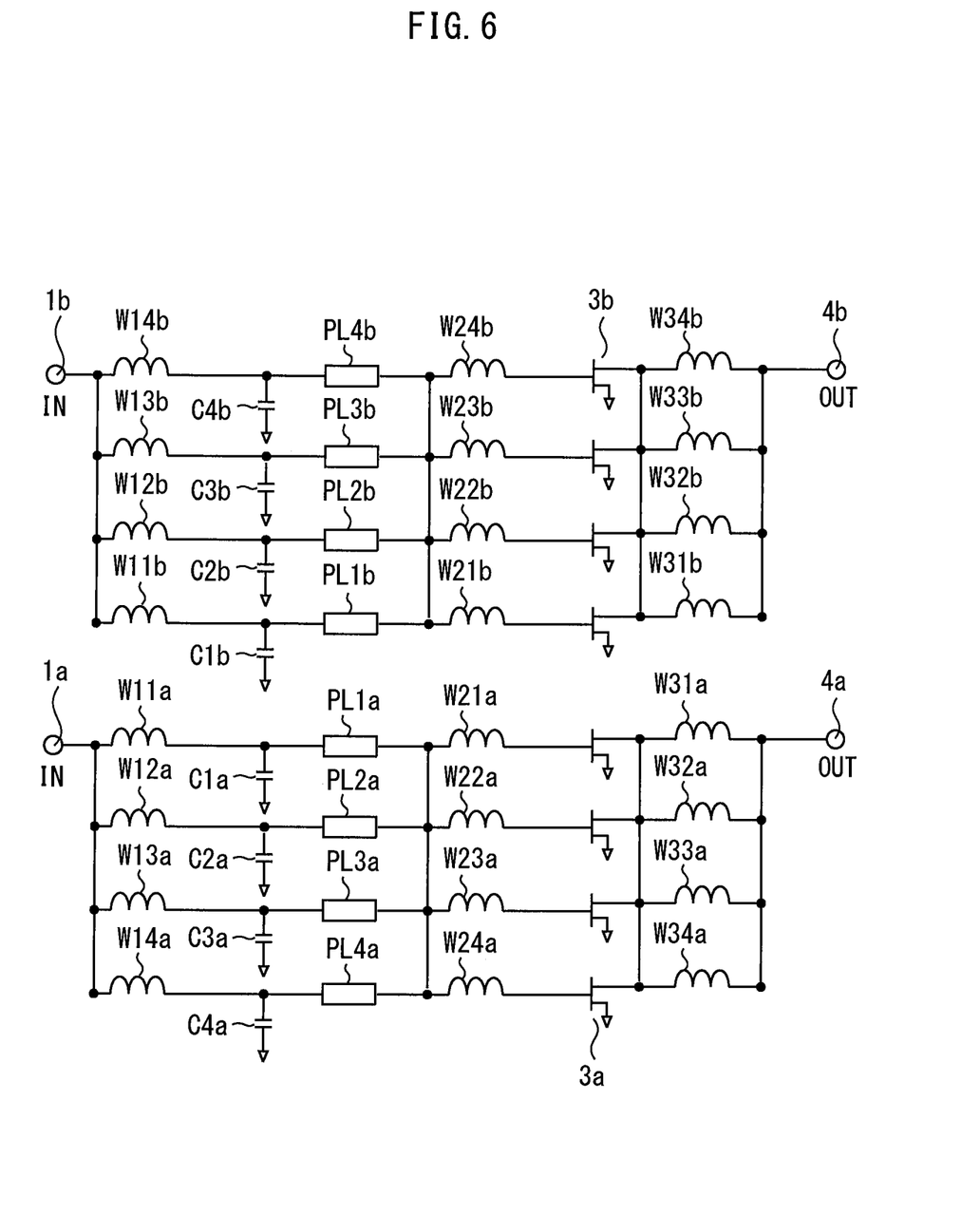
FIG. 6 is an equivalent circuit diagram.

FIG. 5 is a diagram illustrating the inside of the package of an amplifier according to Embodiment 4. FIG. 6 is an equivalent circuit diagram of the amplifier illustrated in FIG. 5. FIG. 5 illustrates a first input matching substrate 5a and a second input matching substrate 5b. The first input matching substrate 5a includes a plurality of cells in each of which a first input pad, a first capacitor, and a first output pad are connected with each other through a first transmission line. The first input matching substrate 5a includes four first input pads partitioned by resistors R1a, R2a, and R3a. The four first input pads are connected with the input bonding wires W11a, W12a, W13a, and W14a, respectively. First capacitors C1a, C2a, C3a, and C4a are each provided between the corresponding one of the four first input pads and the corresponding one of four first output pads P1a, P2a, P3a, and P4a. The first capacitors C1a, C2a, C3a, and C4a form a parallel capacitor connected with the ground through via holes V.

The first transmission lines include a first nearby transmission line PL1a nearest to the second input matching substrate 5b, a first remote transmission line PL4a farthest from the second input matching substrate 5b, and first middle transmission lines PL2a and PL3a positioned between the first nearby transmission line PL1a and the first remote transmission line PL4a.

The first nearby transmission line PL1a connects the first capacitor C1a to the corresponding first input pad and connects the first capacitor C1a to the first output pad P1a. The first middle transmission lines PL2a and PL3a connect the first capacitors C2a and C3a to the corresponding first input pads, respectively, and connect the first capacitors C2a and C3a to the first output pads P2a and P3a, respectively. The first remote transmission line PL4a connects the first capacitor C4a to the corresponding first input pad and connects the first capacitor C4a to the first output pad P4a. Accordingly, four cells are included in the first input matching substrate 5a. The terms of the first nearby transmission line PL1a, the first middle transmission lines PL2a and PL3a, and the first remote transmission line PL4a may be interpreted as a line connecting the corresponding capacitor and the corresponding output pad, not including a line connecting the first input pad and the capacitor.

The second input matching substrate 5b includes a plurality of cells in each of which a second input pad, a second capacitor, and a second output pad are connected with each other through a second transmission line. The second input matching substrate 5b includes four second input pads partitioned by resistors R1b, R2b, and R3b. The four second input pads are connected with the input bonding wires W11b, W12b, W13b, and W14b, respectively. Second capacitors C1b, C2b, C3b, and C4b are each provided between the corresponding one of the four second input pads and the corresponding one of four second output pads P1b, P2b, P3b, and P4b. The second capacitors C1b, C2b, C3b, and C4b form a parallel capacitor connected with the ground through via holes V.

The second transmission lines include a second nearby transmission line PL1b nearest to the first input matching substrate 5a, a second remote transmission line PL4b farthest from the first input matching substrate 5a, and second middle transmission lines PL2b and PL3b positioned between the second nearby transmission line PL1b and the second remote transmission line PL4b.

The second nearby transmission line PL1b connects the second capacitor C1b to the corresponding second input pad and connects the second capacitor C1b to the second output pad P1b. The second middle transmission lines PL2b and PL3b connect the second capacitors C2b and C3b to the corresponding second input pads, respectively, and connect the second capacitors C2b and C3b to the second output pads P2b and P3b, respectively. The second remote transmission line PL4b connects the second capacitor C4b to the corresponding second input pad and connects the second capacitor C4b to the second output pad P4b. Accordingly, four cells are included in the second input matching substrate 5b. The terms of the second nearby transmission line PL1b, the second middle transmission lines PL2b and PL3b, and the second remote transmission line PL4b may be interpreted as a line connecting the corresponding capacitor and the corresponding output pad, not including a line connecting the second input pad and the capacitor.

As illustrated in FIG. 5, the first nearby transmission line PL1a, the first remote transmission line PL4a, the second nearby transmission line PL1b, and the second remote transmission line PL4b are longer than the first middle transmission lines PL2a and PL3a and the second middle transmission lines PL2b and PL3b. The first remote transmission line PL4a and the second remote transmission line PL4b are longer than the first nearby transmission line PL1a and the second nearby transmission line PL1b.

The input bonding wires W11a, W12a, W13a, and W14a connect the input terminal 1a to the respective first input pads. The input bonding wires W11b, W12b, W13b, and W14b connect the input terminal 1b to the respective second input pads. The first bonding wires connect the first output pads P1a, P2a, P3a, and P4a to first gate pads G1a, G1a, G3a, and G4a, respectively, of the first transistor chip 3a. The second bonding wires connect the second output pads P1b, P2b, P3b, and P4b to second gate pads G1b, G2b, G3b, and G4b, respectively, of the second transistor chip 3b. For example, the lengths, directions, heights, and wire diameters of the first bonding wires and the second bonding wires may be equal.

In the amplifier according to Embodiment 4, ununiformity of the mutual inductance of the first bonding wires and the second bonding wires can be compensated by adjusting the lengths, in other words, the self-inductance of the transmission lines of the input matching substrates. Accordingly, variance of the amplitudes and phases of signals input to the transistors of the cells is reduced even when the transistor chips are adjacent to each other at a narrow interval due to package size reduction. Since the transistors uniformly or substantially uniformly operate, the output electrical power, the gain, and the efficiency can be improved.

Embodiment 5

Figure 7:
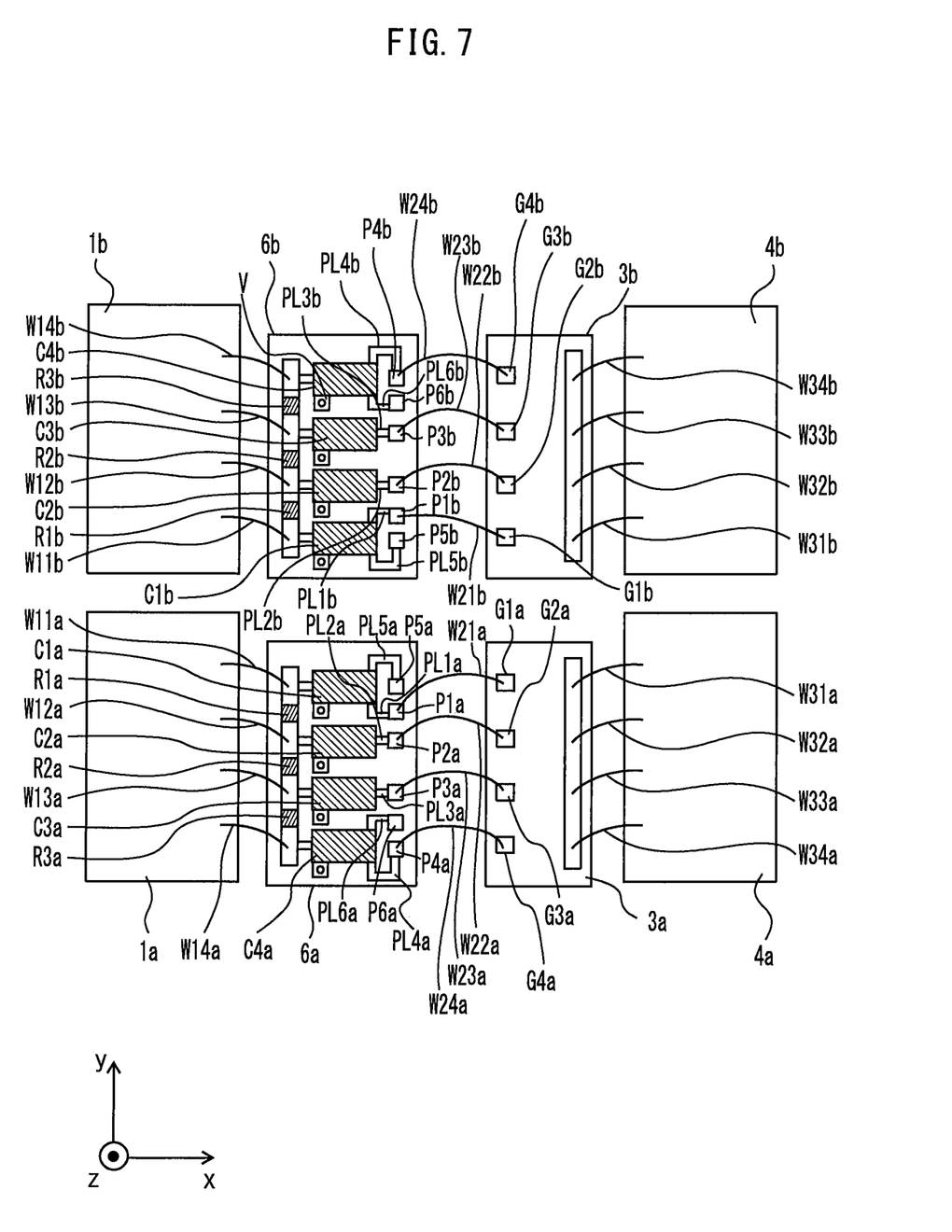
FIG. 7 is a plan view of an amplifier according to Embodiment 5.

FIG. 7 is a diagram illustrating the inside of the package of an amplifier according to Embodiment 5. A first input matching substrate 6a has a configuration similar to that of the first input matching substrate 5a in FIG. 5 but includes a first auxiliary line PL5a, a first auxiliary output pad P5a, a second auxiliary line PL6a, and a second auxiliary output pad P6a, which is different from the first input matching substrate 5a in FIG. 5. The first auxiliary line PL5a is connected with the first capacitor C1a connected with the first nearby transmission line PL1a. The first auxiliary output pad P5a is connected with the first auxiliary line PL5a. The second auxiliary line PL6a is connected with the first capacitor C4a connected with the first remote transmission line PL4a. The second auxiliary output pad P6a is connected with the second auxiliary line PL6a. The first auxiliary output pad P5a and the second auxiliary output pad P6a can be connected with bonding wires but are connected with no bonding wires. The heights and diameters of the first nearby wire W21a and the first remote wire W24a may be equal to the heights and diameters of the first middle wires W22a and W23a.

A second input matching substrate 6b has a configuration similar to that of the second input matching substrate 5b in FIG. 5 but includes a third auxiliary line PL5b, a third auxiliary output pad P5b, a fourth auxiliary line PL6b, and a fourth auxiliary output pad P6b, which is different from the second input matching substrate 5b in FIG. 5. The third auxiliary line PL5b is connected with the second capacitor C1b connected with the second nearby transmission line PL1b. The third auxiliary output pad P5b is connected with the third auxiliary line PL5b. The fourth auxiliary line PL6b is connected with the second capacitor C4b connected with the second remote transmission line PL4b. The fourth auxiliary output pad P6b is connected with the fourth auxiliary line PL6b. The third auxiliary output pad P5b and the fourth auxiliary output pad P6b can be connected with bonding wires but are connected with no bonding wires. The heights and diameters of the second nearby wire W21b and the second remote wire W24b may be equal to the heights and diameters of the second middle wires W22b and W23b.

The first auxiliary line PL5a provides a line longer than the first nearby transmission line PL1a. The second auxiliary line PL6a provides a line shorter than the first remote transmission line PL4a and longer than the first middle transmission lines PL2a and PL3a. The third auxiliary line PL5b provides a line longer than the second nearby transmission line PL1b. The fourth auxiliary line PL6b provides a line shorter than the second remote transmission line PL4b and longer than the second middle transmission lines PL2b and PL3b.

The first auxiliary line PL5a, the first auxiliary output pad P5a, the second auxiliary line PL6a, and the second auxiliary output pad P6a are provided so that the first input matching substrate 6a has a transmission pattern symmetric with respect to the x axis. The third auxiliary line PL5b, the third auxiliary output pad P5b, the fourth auxiliary line PL6b, and the fourth auxiliary output pad P6b are provided so that the second input matching substrate 6b is symmetric with respect to the x axis. The first input matching substrate 6a and the second input matching substrate 6b have the same configuration except for wire connection positions. Two selectable lines are provided at both ends of each of these input matching substrates, and thus transmission lines for uniformly operating cells of the transistors can be provided in accordance with arrangement of the input matching substrates.

The lengths and thicknesses of the first bonding wires and the second bonding wires may be uniform. In this case, variance of the self-inductance due to the wires can be avoided.

Embodiment 6

Figure 8:
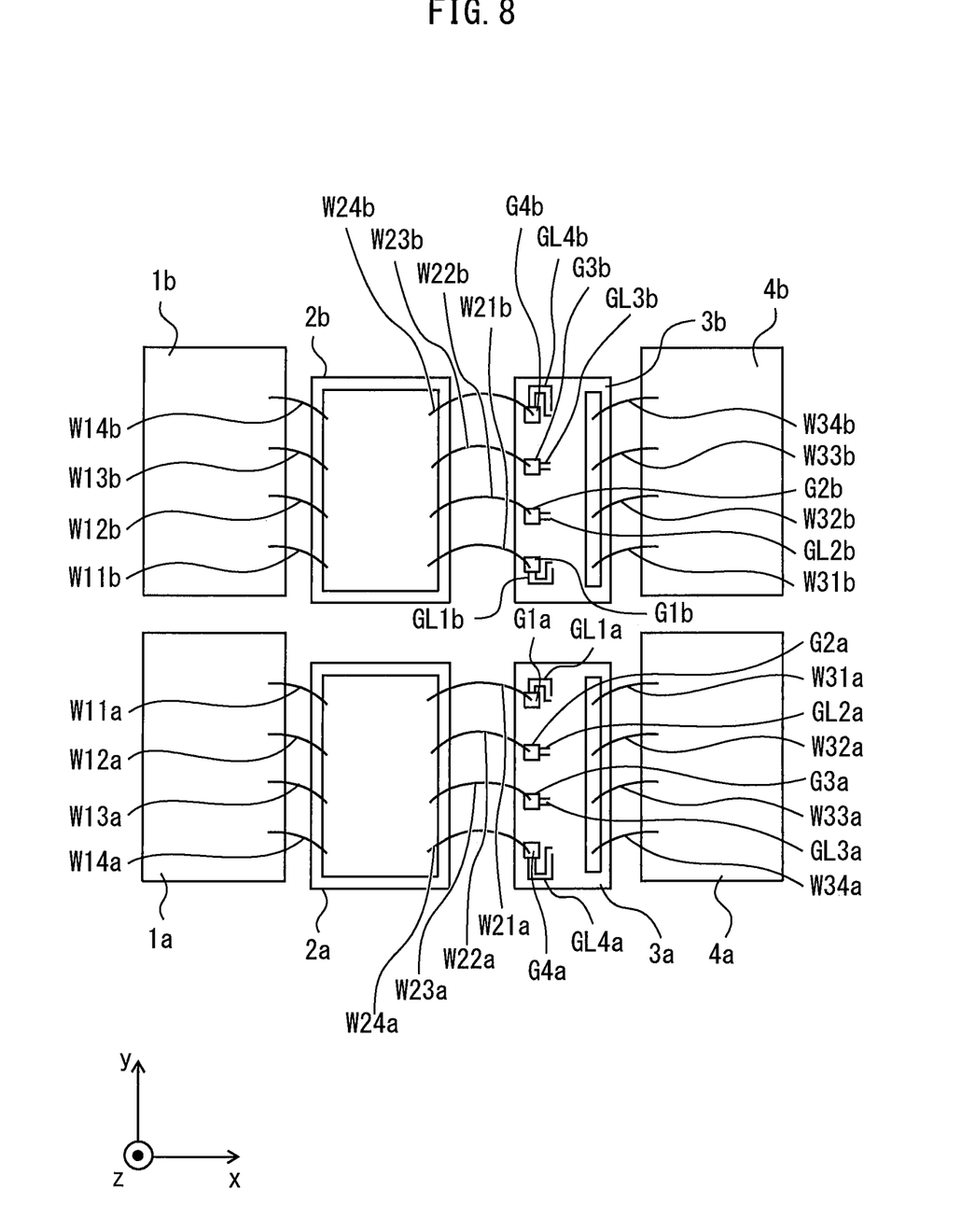
FIG. 8 is a plan view of an amplifier according to Embodiment 6.
Figure 9:
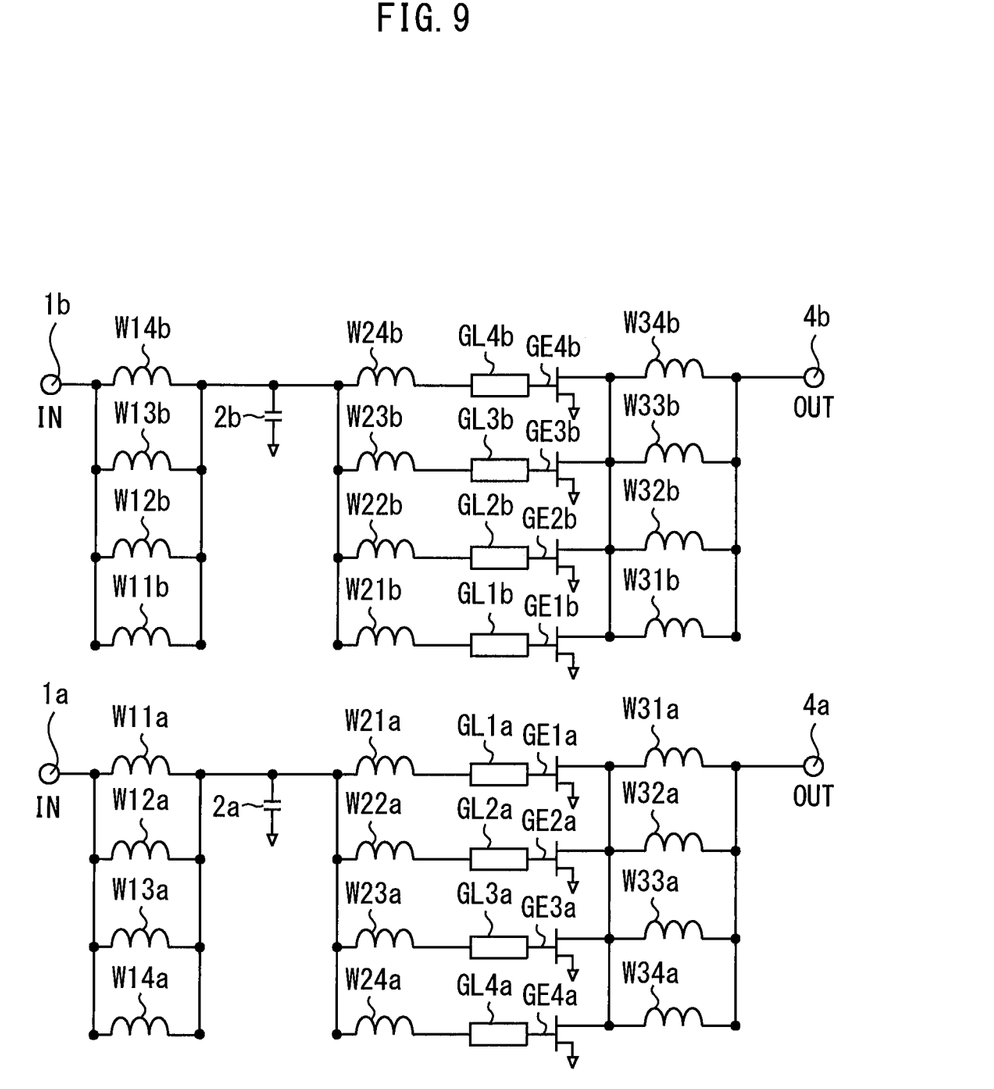
FIG. 9 is an equivalent circuit diagram.

FIG. 8 is a diagram illustrating the inside of the package of an amplifier according to Embodiment 6. FIG. 9 is an equivalent circuit diagram of the amplifier in FIG. 8. FIG. 8 illustrates the first transistor chip 3a and the input matching substrate 2a provided beside. The first transistor chip 3a includes the first gate pads G1a, G2a, G3a, and G4a, a plurality of first gate transmission lines, and first gate electrodes GE1a, GE2a, GE3a, and GE4a. The first gate electrodes GE1a, GE2a, GE3a, and GE4a are illustrated in FIG. 9. The first gate transmission lines include a first nearby line GL1a nearest to the second transistor chip 3b, a first remote line GL4a farthest from the second transistor chip 3b, and first middle lines GL2a and GL3a positioned between the first nearby line GL1a and the first remote line GL4a.

One cell includes the first gate pad G1a, the first nearby line GL1a connected with the first gate pad G1a, and the first gate electrode GE1a connected with the first nearby line GL1a. Another cell includes the first gate pad G2a, the first middle line GL2a connected with the first gate pad G2a, and the first gate electrode GE2a connected with the first middle line GL2a. Another cell includes the first gate pad G3a, the first middle line GL3a connected with the first gate pad G3a, and the first gate electrode GE3a connected with the first middle line GL3a. Another cell includes the first gate pad G4a, the first remote line GL4a connected with the first gate pad G4a, and the first gate electrode GE4a connected with the first remote line GL4a. Accordingly, the multiple cells are formed in the first transistor chip 3a.

The second transistor chip 3b is provided beside the input matching substrate 2b. The second transistor chip 3b includes the second gate pads G1b, G2b, G3b, and G4b, a plurality of second gate transmission lines, and second gate electrodes GE1b, GE2b, GE3b, and GE4b. The second gate electrodes GE1b, GE2b, GE3b, and GE4b are illustrated in FIG. 9. The second gate transmission lines include a second nearby line GL1b nearest to the first transistor chip 3a, a second remote line GL4b farthest from the first transistor chip 3a, and second middle lines GL2b and GL3b positioned between the second nearby line GL1b and the second remote line GL4b.

One cell includes the second gate pad G1b, a second gate transmission line connected with the second gate pad G1b, and the second gate electrode GE1b connected with the second gate transmission line. Another cell includes the second gate pad G2b, a second gate transmission line connected with the second gate pad G2b, and the second gate electrode GE2b connected with the second gate transmission line. Another cell includes the second gate pad G3b, a second gate transmission line connected with the second gate pad G3b, and the second gate electrode GE3b connected with the second gate transmission line. Another cell includes the second gate pad G4b, a second gate transmission line connected with the second gate pad G4b, and the second gate electrode GE4b connected with the second gate transmission line. Accordingly, the multiple cells are formed in the second transistor chip 3b.

The first nearby line GL1a, the first remote line GL4a, the second nearby line GL1b, and the second remote line GL4b are longer than the first middle lines GL2a and GL3a and the second middle lines GL2b and GL3b. The first remote line GL4a and the second remote line GL4b are longer than the first nearby line GL1a and the second nearby line GL1b.

The lengths, directions, heights, and wire diameters of the first bonding wires and the second bonding wires may be equal. With the amplifier according to Embodiment 6, ununiformity of the mutual inductance of the first bonding wires and the second bonding wires when two transistor chips are adjacent to each other can be compensated by adjusting the lengths of the first gate transmission lines and the second gate transmission lines to adjust the self-inductance thereof. Thus, variance of the amplitudes and phases of signals input to the transistors of the cells is reduced even when the transistor chips are adjacent to each other at a narrow interval due to package size reduction. Since the transistors uniformly or substantially uniformly operate, the output electrical power, the gain, and the efficiency can be improved.

Features of the amplifiers according to the above-described embodiments may be combined to achieve an increased effect.

REFERENCE SIGNS LIST 1a, 1b Input terminal
W11a, W12a, W13a, W14a, W11b, W12b, W13b, W14b Input bonding wire
2a, 2b Input matching substrate
W21a First nearby wire
W22a, W23a First middle wire
W24a First remote wire
W21b Second nearby wire
W22b, W23b Second middle wire
W24b Second remote wire
3a First transistor chip
3b Second transistor chip

The invention claimed is:
1. An amplifier comprising:
an input terminal;
an input matching substrate;
a plurality of input bonding wires connecting the input terminal and the input matching substrate;
a first transistor chip including a plurality of cells and provided beside the input matching substrate;
a second transistor chip including a plurality of cells and provided beside the input matching substrate;
a plurality of first bonding wires connecting the input matching substrate and the first transistor chip; and
a plurality of second bonding wires connecting the input matching substrate and the second transistor chip, wherein
the first bonding wires include a first nearby wire nearest to the second bonding wires, a first remote wire farthest from the second bonding wires, and a first middle wire positioned between the first nearby wire and the first remote wire, the second bonding wires include a second nearby wire nearest to the first bonding wires, a second remote wire farthest from the first bonding wires, and a second middle wire positioned between the second nearby wire and the second remote wire, self-inductance of the first nearby wire, the first remote wire, the second nearby wire, and the second remote wire is larger than self-inductance of the first middle wire and the second middle wire, and self-inductance of the first remote wire and the second remote wire is larger than self-inductance of the first nearby wire and the second nearby wire.

2. The amplifier according to claim 1, wherein the first nearby wire, the first remote wire, the second nearby wire, and the second remote wire are longer than the first middle wire and the second middle wire, and the first remote wire and the second remote wire are longer than the first nearby wire and the second nearby wire.

3. The amplifier according to claim 2, further comprising:

an output terminal; and a package to which the input terminal and the output terminal are attached and that houses the input matching substrate, the first transistor chip, and the second transistor chip.

4. The amplifier according to claim 2, wherein inductance of the first bonding wires and the second bonding wires is uniform.

5. The amplifier according to claim 1, wherein the first nearby wire, the first remote wire, the second nearby wire, and the second remote wire are higher than the first middle wire and the second middle wire, and the first remote wire and the second remote wire are higher than the first nearby wire and the second nearby wire.

6. The amplifier according to claim 5, further comprising:

an output terminal; and a package to which the input terminal and the output terminal are attached and that houses the input matching substrate, the first transistor chip, and the second transistor chip.

7. The amplifier according to claim 5, wherein inductance of the first bonding wires and the second bonding wires is uniform.

8. The amplifier according to claim 1, wherein the first nearby wire, the first remote wire, the second nearby wire, and the second remote wire are narrower than the first middle wire and the second middle wire, and the first remote wire and the second remote wire are narrower than the first nearby wire and the second nearby wire.

9. The amplifier according to claim 8, further comprising:

an output terminal; and a package to which the input terminal and the output terminal are attached and that houses the input matching substrate, the first transistor chip, and the second transistor chip.

10. The amplifier according to claim 8, wherein inductance of the first bonding wires and the second bonding wires is uniform.

11. The amplifier according to claim 1, further comprising:

an output terminal; and a package to which the input terminal and the output terminal are attached and that houses the input matching substrate, the first transistor chip, and the second transistor chip.

12. The amplifier according to claim 11, wherein inductance of the first bonding wires and the second bonding wires is uniform.

13. The amplifier according to claim 1, wherein inductance of the first bonding wires and the second bonding wires is uniform.

14. An amplifier comprising:

an input terminal;

a first input matching substrate including a plurality of cells in each of which a first input pad, a first capacitor, and a first output pad are connected with each other through a first transmission line;

a second input matching substrate including a plurality of cells in each of which a second input pad, a second capacitor, and a second output pad are connected with each other through a second transmission line;

a plurality of input bonding wires each connecting the input terminal and the corresponding first input pad and connecting the input terminal and the corresponding second input pad;

a first transistor chip including a plurality of cells and provided beside the first input matching substrate;

a second transistor chip including a plurality of cells and provided beside the second input matching substrate;

a plurality of first bonding wires each connecting the corresponding first output pad and the first transistor chip; and a plurality of second bonding wires each connecting the corresponding second output pad and the second transistor chip, wherein the first transmission lines include a first nearby transmission line nearest to the second input matching substrate, a first remote transmission line farthest from the second input matching substrate, and a first middle transmission line positioned between the first nearby transmission line and the first remote transmission line, the second transmission lines include a second nearby transmission line nearest to the first input matching substrate, a second remote transmission line farthest from the first input matching substrate, and a second middle transmission line positioned between the second nearby transmission line and the second remote transmission line, the first nearby transmission line, the first remote transmission line, the second nearby transmission line, and the second remote transmission line are longer than the first middle transmission line and the second middle transmission line, and the first remote transmission line and the second remote transmission line are longer than the first nearby transmission line and the second nearby transmission line.

15. The amplifier according to claim 14, further comprising:

a first auxiliary line connected with the first capacitor connected with the first nearby transmission line;

a first auxiliary output pad connected with the first auxiliary line;

a second auxiliary line connected with the first capacitor connected with the first remote transmission line;

a second auxiliary output pad connected with the second auxiliary line;

a third auxiliary line connected with the second capacitor connected with the second nearby transmission line;

a third auxiliary output pad connected with the third auxiliary line;

a fourth auxiliary line connected with the second capacitor connected with the second remote transmission line; and a fourth auxiliary output pad connected with the fourth auxiliary line.

16. The amplifier according to claim 15, wherein the first auxiliary line provides a line longer than the first nearby transmission line, the second auxiliary line provides a line shorter than the first remote transmission line and longer than the first middle transmission line, the third auxiliary line provides a line longer than the second nearby transmission line, and the fourth auxiliary line provides a line shorter than the second remote transmission line and longer than the second middle transmission line.

17. The amplifier according to claim 15, wherein lengths and thicknesses of the first bonding wires and the second bonding wires are uniform.

18. The amplifier according to claim 14, wherein lengths and thicknesses of the first bonding wires and the second bonding wires are uniform.

19. An amplifier comprising:

an input terminal;

an input matching substrate;

a plurality of input bonding wires connecting the input terminal and the input matching substrate;

a first transistor chip including a plurality of cells each including a first gate pad, a first gate transmission line connected with the first gate pad, and a first gate electrode connected with the first gate transmission line, the first transistor chip being provided beside the input matching substrate;

a second transistor chip including a plurality of cells each including a second gate pad, a second gate transmission line connected with the second gate pad, and a second gate electrode connected with the second gate transmission line, the second transistor chip being provided beside the input matching substrate;

a plurality of first bonding wires each connecting the input matching substrate and the corresponding first gate pad; and a plurality of second bonding wires each connecting the input matching substrate and the corresponding second gate pad, wherein the first gate transmission lines include a first nearby line nearest to the second transistor chip, a first remote line farthest from the second transistor chip, and a first middle line positioned between the first nearby line and the first remote line, the second gate transmission lines include a second nearby line nearest to the first transistor chip, a second remote line farthest from the first transistor chip, and a second middle line positioned between the second nearby line and the second remote line, the first nearby line, the first remote line, the second nearby line, and the second remote line are longer than the first middle line and the second middle line, and the first remote line and the second remote line are longer than the first nearby line and the second nearby line.

20. The amplifier according to claim 19, wherein lengths and thicknesses of the first bonding wires and the second bonding wires are uniform.

* * * * *